(12) United States Patent
Fukuoka et al.

(10) Patent No.: US 6,939,741 B2
(45) Date of Patent: Sep. 6, 2005

(54) IC CHIP MANUFACTURING METHOD

(75) Inventors: Masateru Fukuoka, Mishima-gun (JP); Yasuhiko Oyama, Osaka (JP); Munehiro Hatai, Mishima-gun (JP); Satoshi Hayashi, Mishima-gun (JP); Shigeru Danjo, Mishima-gun (JP); Masahiko Kitamura, Ota-ku (JP); Koichi Yajima, Ota-ku (JP)

(73) Assignees: Sekisui Chemical Co., Ltd., Osaka (JP); Disco Corporation, Tokyo (JP)

( * ) Notice: Subject to any disclaimer, the term of this patent is extended or adjusted under 35 U.S.C. 154(b) by 0 days.

(21) Appl. No.: 10/475,257
(22) PCT Filed: Jan. 15, 2003
(86) PCT No.: PCT/JP03/00238
§ 371 (c)(1),
(2), (4) Date: May 3, 2004
(87) PCT Pub. No.: WO03/060972
PCT Pub. Date: Jul. 24, 2003

(65) Prior Publication Data
US 2004/0185639 A1 Sep. 23, 2004

(30) Foreign Application Priority Data
Jan. 15, 2002 (JP) ........................ 2002-006556
Jan. 15, 2002 (JP) ........................ 2002-006557
Jan. 15, 2002 (JP) ........................ 2002-006558

(51) Int. Cl.$^7$ ........................ H01L 21/304; H01L 21/68; B24B 37/04; C09J 7/02
(52) U.S. Cl. ........................ 438/114; 438/434; 438/113
(58) Field of Search ........................ 438/113, 114, 438/464

(56) References Cited
U.S. PATENT DOCUMENTS
6,426,275 B1 * 7/2002 Arisa ........................ 438/464
2002/0127821 A1 * 9/2002 Ohya et al. .................. 438/459

FOREIGN PATENT DOCUMENTS

| EP | 0 981 156 A2 | 2/2000 | |
|---|---|---|---|
| JP | 7022358 | 1/1995 | |
| JP | 10125768 | 5/1998 | |
| JP | 2001044142 | 2/2001 | |
| JP | 2001348539 | 12/2001 | |
| JP | 2003-151940 | * 5/2003 | ......... H01L/21/304 |

* cited by examiner

Primary Examiner—Amir Zarabian
Assistant Examiner—Pamela E Perkins
(74) Attorney, Agent, or Firm—Connolly, Bove, Lodge & Hutz, LLP

(57) ABSTRACT

It is an object of the invention to provide a method for manufacturing an IC chip wherein a wafer is prevented from being damaged and the ease of handling thereof is improved so that the wafer can be appropriately processed into IC chips, even if a thickness of the wafer is extremely reduced to approximately 50 $\mu$m.

The invention provides a method for manufacturing an IC chip comprising, at least: the step of securing a wafer to a support plate via a support tape having a surface layer comprising an adhesive (A) containing a gas generating agent for generating a gas due to stimulation and a surface layer comprising an adhesive (B); the step of polishing said wafer with securing said wafer to said support plate via said support tape; the step of adhering a dicing tape to said polished wafer; the step of providing said stimulation to said adhesive (A) layer; the step of removing said support tape from said wafer; and the step of dicing said wafer, which comprises adhering said surface layer comprising adhesive (A) to said wafer and adhering said surface layer comprising adhesive (B) to said support plate in the step of securing said wafer to said support plate via said support tape, providing said stimulation while uniformly sucking under reduced pressure the entirety of said wafer from the dicing tape side thereof, and then removing said support tape from said wafer in the step of providing stimulation to said adhesive (A) layer and in the step of removing said support tape from said wafer.

6 Claims, No Drawings ions of IC chips have widened,
IC CHIP MANUFACTURING METHOD

TECHNICAL FIELD

The present invention relates to a method for manufacturing an IC chip wherein a wafer is prevented from being damaged and the ease of handling thereof is improved so that the wafer can be appropriately processed into IC chips even if a thickness of the wafer is extremely reduced to approximately 50 µm.

BACKGROUND ART

A predetermined circuit pattern is formed on the surface of a wafer by utilizing a photoresist, after a high-purity single crystal semiconductor has been sliced in order to gain the wafer, and, then, the rear surface of the wafer is polished by means of a polishing machine so as to reduce the thickness of the wafer from approximately 100 to 600 µm and, finally, the wafer is diced so as to gain chips and, thereby, a conventional semiconductor integrated circuit (IC chip) is manufactured.

Here, at the time of the above-described polishing, an adhesive sheet or the like (tape for polishing) is adhered to the top surface of the wafer so that the wafer is prevented from being damaged and so that the polishing process is easily carried out, and at the time of the above-described dicing, an adhesive sheet or the like (dicing tape) is adhered to the rear surface of the wafer so that the wafer is diced in an adhered and secure condition, and the formed chips are picked by being pushed up by a needle from the film substrate side of the dicing tape and are secured to a die pad.

In recent years, as applications of IC chips have widened, an extremely thin wafer having a thickness of approximately 50 µm that can be used in an IC card or the like, or that can be utilized in a layered form has been in demand. However, the wafer having a thickness of approximately 50 µm greatly develops a warp and easily cracks due to impact as compared with that of a conventional wafer with a thickness of from approximately 100 to 600 µm and, therefore, in the case where a similar process for a conventional wafer is carried out, in the step of polishing which is easily suffered an impact, in the step of dicing and at the time when a bump is manufactured on an electrode of an IC chip, such a thin wafer easily becomes damaged, resulting in a poor yield. Therefore, improvement in the ease of handling of the wafer in the process wherein an IC chip is fabricated from a wafer having a thickness of approximately 50 µm has become an important issue to be solved.

In contrast to this, a method has been proposed wherein a wafer is adhered to a support plate via a support tape and polishing is carried out in securing to the support plate. Improvement in the strength and flatness of the wafer can be secured by the support plate and the ease of handling of the wafer can be improved according to this method.

However, there is a problem with this method, wherein a wafer having a thickness of approximately 50 µm is weak in structural strength and, therefore, damage or deformation occurs due to a load at the time when the wafer is removed from the support plate or the support tape. In addition, though extremely thin wafers having a thickness of approximately 50 µm can be laminated in greater numbers than conventional wafers having a thickness of from approximately 100 to 600 µm, there is a problem wherein such extremely thin wafers are required a higher level of flatness in order to laminate many layers.

SUMMARY OF THE INVENTION

A purpose of the present invention in view of the above description is to provide a method for manufacturing an IC chip wherein a wafer is prevented from being damaged and the ease of handling thereof is improved so that the wafer can be appropriately processed into IC chips, even if a thickness of the wafer is extremely reduced to approximately 50 µm.

The first present invention is a method for manufacturing an IC chip having, at least: the step of securing a wafer to a support plate via a support tape having a surface layer comprising an adhesive (A) containing a gas generating agent for generating a gas due to stimulation and a surface layer comprising an adhesive (B); the step of polishing said wafer with securing said wafer to said support plate via said support tape; the step of adhering a dicing tape to said polished wafer; the step of providing said stimulation to said adhesive (A) layer; the step of removing said support tape from said wafer; and the step of dicing said wafer, which comprises adhering said surface layer comprising adhesive (A) to said wafer and adhering said surface layer comprising adhesive (B) to said support plate in the step of securing said wafer to said support plate via said support tape, and providing said stimulation while uniformly sucking under reduced pressure the entirety of said wafer from the dicing tape side thereof, and then removing said support tape from said wafer in the step of providing stimulation to said adhesive (A) layer and in the step of removing said support tape from said wafer.

The second present invention is a method for manufacturing an IC chip comprising, at least: the step of securing a wafer to a support plate via a support tape having a surface layer comprising an adhesive (A) containing a gas generating agent for generating a gas due to stimulation and a surface layer comprising an adhesive (B); the step of polishing said wafer with securing said wafer to said support plate via said support tape; the step of adhering a dicing tape to said polished wafer; the step of providing said stimulation to said adhesive (A) layer; the step of removing said support tape from said wafer; and the step of dicing said wafer, which comprises adhering said surface layer comprising adhesive (A) to said wafer and adhering said surface layer comprising adhesive (B) to said support plate in the step of securing said wafer to said support plate via said support tape, and said dicing tape is not deformed by the pressure of a gas generated from said gas generating agent.

The third present invention is a method for manufacturing an IC chip having at least: the step of securing a wafer to a support plate via a support tape having a surface layer comprising an adhesive (A) containing a gas generating agent for generating a gas due to stimulation and a surface layer comprising an adhesive (B); the step of polishing said wafer with securing said wafer to said support plate via said support tape; the step of adhering a dicing tape to said polished wafer; the step of providing said stimulation to said adhesive (A) layer; the step of removing said support tape from said wafer; and the step of dicing said wafer, which comprises adhering said surface layer comprising adhesive (A) to said wafer and adhering said surface layer comprising adhesive (B) to said support plate in the step of securing said wafer to said support plate via said support tape, and said stimulation is provided while uniformly applying a load to the entirety of said wafer in the step of providing said stimulation to said adhesive (A) layer.

The method for manufacturing an IC chip according to the first, second or third present invention may comprise the step of removing the support plate from the support tape between the steps of adhering a dicing tape to the polished wafer and removing the support tape from the wafer.

DETAILED DISCLOSURE OF THE INVENTION

The present invention is described in detail below.

The method for manufacturing an IC chip according to the present first, second or third invention has, at least, the step of securing a wafer to a support plate via a support tape having a surface layer comprising an adhesive (A) containing a gas generating agent for generating a gas due to stimulation and a surface layer comprising an adhesive (B).

The above-described support tape may be any type of tape as long as it has a surface layer comprising an adhesive (A) containing a gas generating agent for generating a gas due to stimulation and a surface layer comprising an adhesive (B) such as an adhesive non-supported tape having adhesive layers on both surfaces or a double-sided adhesive tape wherein adhesive layers are formed on both surfaces of the substrate.

In the present specification a non-supported tape means a tape made solely of an adhesive layer without a substrate and may comprise only one adhesive layer or may comprise a plurality of adhesive layers.

When the above-described substrate is used and the stimulation that reduces the adhesive force of the adhesive (A) layer is stimulation by means of light, it is preferable for the above-described substrate to allow the transmission or passing through of light and a sheet comprising a transparent resin such as, for example, acryl, olefin, polycarbonate, vinyl chloride, ABS, polyethylene terephthalate (PET), nylon, urethane or polyimide, a sheet having a structure in a net form and a sheet in which holes are created can be cited as the substrate.

The above-described support tape has a surface layer comprising an adhesive (A) containing a gas generating agent for generating a gas due to stimulation.

Stimulation by means of light, heat, ultrasonic waves, for example, can be cited as the above-described stimulation. In particular, stimulation by means of light or heat is preferable. Ultraviolet light, visible light, or the like, can be cited as the above-described light. It is preferable for the above-described adhesive (A) to allow the transmission or passing through of light in the case where stimulation by means of light is used as the above-described stimulation.

The gas generating agent for generating a gas due to the above-described stimulation is not particularly limited and, for example, azo compounds, azide compounds, and the like, can be preferably used.

2,2'-azobis-(N-butyl-2-methylpropionamide), 2,2'-azobis{2-methyl-N-[1,1-bis(hydroxymethyl)-2-hydroxyethyl]propionamide}, 2,2'-azobis{2-methyl-N-[2-(1-hydroxybutyl)] propionamide}, 2,2'-azobis[2-methyl-N-(2-hydroxyethyl) propionamide], 2,2'-azobis[N-(2-propenyl)-2-methylpropionamide], 2,2'-azobis(N-butyl-2-methylpropionamide), 2,2'-azobis(N-cyclohexyl-2-methylpropionamide), 2,2'-azobis[2-(5-methyl-2-imidazoline-2-yl)propane] dihydrochloride, 2,2'-azobis[2-(2-imidazoline-2-yl)propane] dihydrochloride, 2,2'-azobis[2-(2-imidazoline-2-yl)propane] disulfate dihydrolate, 2,2'-azobis[2-(3,4,5,6-tetrahydropyrimidine-2-yl)propane] dihydrochloride, 2,2'-azobis{2-[1-(2-hydroxyethyl)-2-imidazoline-2-yl]propane}dihydrochloride, 2,2'-azobis[2-(2-imidazoline-2-yl)propane], 2,2'-azobis(2-methylpropionamidine)dihydrochloride, 2,2'-azobis(2-aminopropane)dihydrochloride, 2,2'-azobis[N-(2-carboxyacyl)-2-methyl-propionamidine, 2,2'-azobis{2-[N-(2-carboxyethyl)amidine]propane}, 2,2'-azobis(2-methylpropione amidoxime), dimethyl2,2'-azobis(2-methyl propionate), dimethyl2,2'-azobis isobutyrate, 4,4'-azobis(4-cyan carbonic acid), 4,4'-azobis(4-cyanopentanoic acid), 2,2'-azobis(2,4,4-trimethylpentane) for example, can be cited as the above azo compounds.

The manufacture of an IC chip comprises the step of carrying out, if necessary, a high temperature treatment and, therefore, 2,2'-azobis(N-butyl-2-methylpropionamide), 2,2'-azobis(N-butyl-2-methylpropionamide) and 2,2'-azobis(N-cyclohexyl-2-methylpropionamide) are preferable from among the above.

These azo compounds generate a nitrogen gas due to stimulation by means of light, heat, or the like.

3-azide methyl-3-methyl oxetane, terephthal azide, p-tert-butyl benzazide and polymers having an azide group such as glycidyl azide polymer gained by ring-opening polymerization of 3-azide methyl-3-methyl oxetane, for example, can be cited as the above-described azide compounds.

These azide compounds generate nitrogen gas due to stimulation by means of light, heat, impulse, and the like.

The above-described azide compounds, from among these gas generating agents, easily resolve when receiving an impulse so as to release nitrogen gas and, therefore, there is a problem wherein the handling thereof is difficult. Furthermore, the above-described azide compounds cause a chain reaction when resolving begins and release nitrogen gas in an explosive and uncontrollable manner and, therefore, there is also a problem wherein a wafer may be damaged by nitrogen gas generated in an explosive manner. Though the amount of the above-described azide compounds that can be used is limited due to the above-described problems, sufficient effects may not be gained with the limited amount that can be used.

On the other hand, the above-described azo compounds are extremely easy to handle because they do not generate a gas due to impact, unlike azide compounds. In addition, the above-described azo compounds do not generate a gas in an explosive manner wherein a chain reaction is caused and, therefore, the wafer is not damaged and the generation of gas can be stopped by suspending irradiation with light and there is the advantage wherein control of adhesion in accordance with application is possible. Accordingly, it is more preferable to use an azo compound as the above-described gas generating agent.

The above-described adhesive (A) layer contains the above-described gas generating agent and, therefore, gas is generated from the gas generating agent in the adhesive (A) layer when stimulation is given to the above-described adhesive (A) layer so that the adhesive force is lowered and the adhered body can easily be removed.

Though the above-described gas generating agent may be dispersed in the adhesive (A) layer, there is a risk wherein the entirety of the adhesive (A) layer may become a foam and may become too soft to allow the adhesive (A) layer to be removable in a smooth manner when the gas generating agent is dispersed in the adhesive (A) layer. Accordingly, it is preferable for only the surface layer portion of the adhesive (A) layer making contact with the support plate to contain a gas generating agent. Gas is generated from a gas generating agent in the surface layer portion of the adhesive (A) layer making contact with the support plate and, in addition, the gas removes at least a portion of the adhesive from the surface of the adhered body so as to lower the adhesive force in the case where only the surface layer portion contains a gas generating agent.

A method for applying adhesive (A), which contains a gas generating agent and has a thickness of from approximately 1 to 20 µm, to the adhesive (A) layer of a support tape and a method for applying or spraying a volatile liquid containing a gas generating agent onto the surface of the adhesive (A) layer of a support tape prepared in advance so that the gas generating agent is uniformly adhered to the surface of the adhesive (A) layer, for example, can be cited as methods for containing a gas generating agent solely in the surface layer portion of the above-described adhesive (A) layer.

In the case where a gas generating agent is adhered to the surface of the adhesive (A) layer, it is preferable to adhere a gas generating agent having an excellent compatibility with adhesive (A) to the surface of the adhesive (A) layer. That is to say, there is a risk wherein the adhesive force may be lowered when a large amount of gas generating agent is adhered to the surface of the adhesive and the adhered gas generating agent may be absorbed by the adhesive layer in the case where the gas generating agent is compatible with the adhesive such that the adhesive force is not lowered.

Here, it is preferable for the above-described surface layer portion to be a portion ranging from the surface of the adhesive layer to a depth of 20 µm, depending on the thickness of the adhesive layer. Here, the surface layer portion referred to herein includes the mode wherein a gas generating agent is uniformly attached to the surface of the adhesive layer or the mode wherein the gas generating agent that has been attached to the surface of the adhesive layer is compatible with the adhesive and is absorbed in the adhesive layer.

It is preferable for the above-described adhesive (A) to have a modulus of elasticity that increases due to stimulation. Stimulation that increases the modulus of elasticity of adhesive (A) may be the same type of stimulation, or may be a different type of stimulation, by means of which gas is generated from the above-described gas generating agent.

A photo-curing adhesive having a main component of an acrylic alkyl ester-based and/or methacrylic alkyl ester-based polymer with an unsaturated bond for radical polymerization within molecules and a main component of a multifunctional oligomer or monomer that radically polymerizes and having, if necessary, a photopolymerizing initiator and a thermosetting adhesive having a main component of an acrylic alkyl ester-based and/or methacrylic alkyl ester-based polymer with an unsaturated bond for radical polymerization within molecules and a main component of a multifunctional oligomer or monomer that radically polymerizes and having a thermal polymerizing initiator, for example, can be cited as the above-described adhesive (A).

Such photo-curing adhesive or thermosetting adhesive, which are postcure-type pressure sensitive adhesives, undergo uniform and rapid integration of the entirety of the adhesive layer through crosslinking by means of irradiation with light or by means of heating and, therefore, the modulus of elasticity thereof increases significantly and the adhesive force is significantly lowered as a result of curing through polymerization. In addition, when gas is generated from the gas generating agent in a hard cured substance, most of the gas that is generated is released to the outside and the released gas removes, at least, a portion of the adhered body from the surface of contact with the adhesive so as to lower the adhesive force.

A (meth)acryl-based polymer having a functional group within molecules (hereinafter referred to as (meth)acryl-based polymer containing a functional group), for example, is synthesized in advance and reacts with a compound (hereinafter referred to as unsaturated compound containing a functional group) having a functional group that reacts to the above-described functional group and an unsaturated bond for radical polymerization within molecules and, thereby, the above-described polymer can be gained.

Here in the present specification (meth)acryl indicates acryl or methacryl.

Acrylic alkyl ester and/or methacrylic alkyl ester wherein the number of carbon atoms in the alkyl group is usually in a range of from 2 to 18 is prepared as the main monomer and this is copolymerized according to a conventional method with a monomer containing a functional group as well as with, if necessary, another type of monomer in order to improve quality that can be copolymerized with the above and, thereby, the above-described (meth)acryl-based polymer containing a functional group can be gained as a polymer having adhesion at room temperature in the same manner as in the case of a general (meth)acryl-based polymer. The average molecular weight of the above-described (meth)acryl-based polymer containing a functional group is usually in a range of from 200,000 to 2,000,000.

Monomers containing a carboxyl group such as acrylic acid, methacrylic acid, or the like; monomers containing a hydroxyl group such as acrylic hydroxyl ethyl, methacrylic hydroxyl ethyl, or the like; monomers containing an epoxy group such as acrylic glycidyl, methacrylic glycidyl, or the like; monomers containing an isocyanate group such as acrylic isocyanate ethyl, methacrylic isocyanate ethyl, or the like; monomers containing an amino group such as acrylic amino ethyl, methacrylic amino ethyl, or the like, for example, can be cited as the above-described monomer containing a functional group.

A variety of monomers used in a general (meth)acryl-based polymer such as vinyl acetate, acrylonitrile, styrene, for example, can be cited as the above-described other monomers that can be copolymerized in order to improve quality.

The same type of monomers containing a functional group as described above can be utilized in accordance with the functional group of the above-described (meth)acryl-based polymer containing a functional group as an unsaturated compound containing a functional group which reacts with the above-described (meth)acryl-based polymer containing a functional group. In the case where the functional group of the above-described (meth)acryl-based polymer containing a functional group is a carboxyl group, for example, monomers containing an epoxy group or monomers containing an isocyanate group are used; in the case where the functional group is a hydroxyl group, monomers containing an isocyanate group; in the case where the functional group is an epoxy group, monomers containing a carboxyl group or monomers containing an amide group such as acrylic amide are used; and in the case where the functional group is an amino group, monomers containing an epoxy group are used.

It is preferable for the above-described multifunctional oligomer or monomer to have a molecular weight of 10,000 or less, and it is more preferable for the molecular weight thereof to be 5,000 or less, and for the lower limit of the number of unsaturated bonds of radical polymerization within this molecule to be two and for the upper limit thereof to be twenty in order that three dimensional crosslinking of the adhesive layer due to heating or irradiation with light be efficiently carried out. Trimethylolpropane triacrylate, tetramethylolmethane tetraacrylate, pentaerythritol triacrylate, pentaerythritol tetraacrylate, dipentaerythritol monohydroxy pentaacrylate, dipentaerythritol hexaacrylate, 1,4-butylene glycol diacrylate, 1,6-hexanediol diacrylate, polyethylene glycol diacrylate, commercially available oligoester acrylate and the same types of methacrylates as are described above, for example, can be cited as the above-described more preferable multifunctional oligomer or monomer. This multifunctional oligomer or monomer may be used alone or two, or more, types may be used simultaneously.

A photopolymerization initiator that is activated by irradiation with light having a wavelength of from 250 nm to 800 nm, for example, can be cited as the above-described photopolymerization initiator and acetophenone derivative compounds such as methoxyacetophenone; benzoin ether-based compounds such as benzoin propyl ether, benzoin isobutyl ether, or the like; ketal derivative compounds such as benzyl dimethyl ketal, acetophenone diethyl ketal, or the like; phosphine oxide derivative compounds; bis($\eta$5-cyclopentadienyl) titanocene derivative compounds; photoradical polymerization initiators such as benzophenone, Michler's ketone, chlorothioxanthone, todecylthioxanthone, dimethylthioxanthone, diethylthioxanthone, $\alpha$-hydroxycyclohexylphenyl ketone, 2-hydroxymethylphenyl propane, for example, can be cited as the above-described photopolymerization initiator. These photopolymerization initiators may be used alone or two, or more, types may be used simultaneously.

Thermopolymerization initiators that decompose by means of heat so as to generate an active radical for initiating polymerization hardening can be cited as the above-described thermopolymerization initiator and, concretely, dicumyl peroxide, di-t-butyl peroxide, t-butyl peroxybenzoate, t-butyl hydroperoxide, benzoyl peroxide, kumen hydroperoxide, diisopropylbenzene hydroperoxide, paramentane hydroperoxide, di-t-butyl peroxide, and the like, for example, can be cited. In particular kumen hydroperoxide, paramentane hydroperoxide, di-t-butyl peroxide, and the like, are appropriate because they have a high thermal decomposition temperature. Commercially available thermopolymerization initiators from among the above are not particularly limited and Perbutyl D, Perbutyl H, Perbutyl P, Permentane H (all manufactured by NOF CORPORATION), for example, are appropriate. These thermopolymerization initiators may be used alone or two, or more, types may be used simultaneously.

The above-described postcure-type pressure sensitive adhesives containing the above-described components may be appropriately mixed with a variety of multifunctional compounds such as isocyanate compounds, melamine compounds, epoxy compounds, and the like, which are mixed if necessary with general adhesives, for the purpose of adjustment of the cohesive strength as an adhesive. In addition, known additives, such as plasticizers, resins, surfactants, waxes, fine particle fillers, may be mixed in.

The above-described support tape has a surface layer comprising adhesive (B) in addition to the surface layer comprising adhesive (A).

The above-described adhesive (B) is not particularly limited and it is preferable for the above-described adhesive (B) to have a property wherein the adhesive force is lowered by means of stimulation in the case where the support plate is removed in advance from the support tape before the step of removal of the support tape from a wafer is carried out, between the step of polishing and the step of dicing, in the method for manufacturing an IC chip according to the first, second or third present invention. Acrylic alkyl ester-based and/or methacrylic alkyl ester-based polymeric polymers having unsaturated bonds for radical polymerization within molecules, and postcure-type pressure sensitive adhesives containing multifunctional oligomers for radical polymerization as the main component, can be used as the adhesive (B) which is used for the above-described adhesive (A).

In the case where the support plate is removed in advance from the support tape before the support tape is removed from a wafer, the support tape can be removed from the wafer more easily in a manner wherein a support tape having flexibility is peeled off.

In addition, in this case it is preferable for the above-described adhesive (B) to contain a gas generating agent for generating gas by means of stimulation. Gas is generated from the gas generating agent in the adhesive (B) layer when stimulation is provided to the above-described adhesive (B) layer since the above-described gas generating agent is contained and, thereby, the adhesive force is lowered so that the adhered body can more easily be removed.

In addition, in the case where the above-described adhesive (B) comprises a postcure-type pressure sensitive adhesive, or the like, adhesive (B) has an excellent adhesion before stimulation is provided and the crosslinking reaction progresses so that adhesive (B) is hardened through the provision of stimulation and, therefore, adhesive (B) is an adhesive having an excellent adhesion before the support tape is removed while adhesive (B) is hardened at the time when the support tape is removed. When gas is generated from a gas generating agent in a hard material, the majority of the generated gas is released to the outside so that the released gas peels off at least a portion of the adhesive from the surface of the adhered body and the adhesive force is lowered.

Though the above-described gas generating agent may be dispersed in the adhesive (B) layer, the entirety of the adhesive (B) layer becomes a foam that becomes too soft due to the dispersion of the gas generating agent in the adhesive (B) layer and, therefore, there is a risk wherein the adhesive (B) layer may not be easily removable. Accordingly, it is preferable to contain the gas generating agent only in the surface layer portion of the adhesive (B) layer making contact with the support plate. In the case where the gas generating agent is only included in the surface layer portion, the adhesive (B) layer can be made sufficiently soft by means of stimulation and the area of contact of the interface is reduced when gas is generated from the gas generating agent in the surface layer portion of the adhesive layer making contact with the support plate and, in addition, the gas peels at least a portion of the adhesive from the surface of the adhered body so as to lower the adhesive force.

A method for applying adhesive (B), which contains a gas generating agent, to the adhesive (B) layer of the support tape so as to have a thickness of from approximately 1 to 20 $\mu$m or a method for uniformly adhering a gas generating agent to the surface of the adhesive layer by applying or spraying a volatile liquid containing the gas generating agent onto the surface of the adhesive (B) layer of the support tape, which has been manufactured in advance, for example, can be cited as a method for containing a gas generating agent in only the surface layer portion of the above-described adhesive layer.

In the case where a gas generating agent is adhered to the surface of the adhesive (B) layer it is preferable for the gas generating agent to be highly compatible with adhesive (B). That is to say, though there is a risk wherein the adhesive force may be lowered when a large amount of gas generating agent is adhered to the surface of the adhesive (B) layer, the adhered gas generating agent is absorbed into the adhesive layer so that the adhesive force is not lowered in the case where the gas generating agent is compatible with the adhesive.

Here, it is preferable for the above-described surface layer portion to be a portion that ranges from the surface of the adhesive to a depth 20 μm, depending on the thickness of the adhesive layer. In addition, the surface layer portion herein described includes the mode wherein a gas generating agent is uniformly adhered to the surface of the adhesive layer and the mode wherein the gas generating agent that has been adhered to the surface of the adhesive layer is absorbed into the adhesive layer due to compatibility with the adhesive.

A wafer is secured to the support plate via a support tape having the above-described surface layer comprising adhesive (A) and having a surface layer comprising adhesive (B).

A slice of a high pure single crystal semiconductor comprising silicon, gallium, arsenic, or the like, for example, can be cited as the above-described wafer. Though the thickness of the above-described wafer is not particularly limited, the thickness is generally in a range of from approximately 500 μm to 1 mm. Here, a predetermined circuit pattern is formed on the surface of the above-described wafer before the wafer is secured to the support plate.

Though the above-described support plate is not particularly limited, it is preferable for the support plate to be transparent in the case where the stimulation that lowers the adhesive force of the adhesive (A) layer is a stimulation by means of light and a glass plate as well as a resin body in a plate form, such as of acryl, olefin, polycarbonate, vinyl chloride, ABS, PET, nylon, urethane, polyimide, and the like, for example, can be cited.

The lower limit of the thickness of the above-described support plate is preferably 500 μm and the upper limit is preferably 3 mm while the lower limit thereof is more preferably 1 mm and the upper limit thereof is more preferably 2 mm. In addition, it is preferable for the dispersion of the thickness of the above-described support plate to be 1%, or less.

The above-described adhesive (A) layer and the above-described wafer are adhered to each other while the above-described adhesive (B) layer and the above-described support plate are adhered to each other in the step of securing the above-described wafer to the above-described support plate via the above-described support tape in accordance with the method for manufacturing an IC chip according to the first, second or third present invention.

The wafer is secured to the support plate via the above-described support tape and, thereby, the wafer is reinforced and ease of handling can be increased so that even an extremely thin wafer having a thickness of approximately 50 μm can be conveyed and processed without undergoing chipping or cracking and can be easily contained in a cassette, or the like. Here, the above-described support tape can easily be removed from an IC chip by providing stimulation after the completion of the sequence of steps for manufacture of the IC chip.

The method for manufacturing an IC chip according to the first, second or third present invention has at least the step of polishing the above-described wafer under the condition wherein the wafer is secured to the above-described support plate via the above-described support tape.

The thickness of the wafer after polishing is not particularly limited while the effects of damage prevention can easily be gained in the case where the wafer is processed and becomes thin, and excellent damage prevention effects can be gained in the case where the thickness of the wafer after polishing is approximately 50 μm, or is in a range of from, for example, 20 to 80 μm.

The method for manufacturing an IC chip according to the first, second or third present invention has, at least, the step of adhering a dicing tape to the above-described polished wafer.

The above-described dicing tape is not deformed due to pressure from the gas generated from the above-described gas generating agent in the method for manufacturing an IC chip according to the second present invention. Such a dicing tape is not particularly limited and a dicing tape gained by adhering a commercially available dicing tape to a reinforcement plate, which is not deformed due to pressure from the gas generated from the gas generating agent, using adhesive as well as a dicing tape wherein an adhesive (C) layer is formed on one surface of a tape substrate that is not deformed due to pressure from the gas generated from the gas generating agent, and the like, can be cited.

The above-described reinforcement plate or tape substrate is not particularly limited as long as it is not deformed due to pressure by the gas generated from the gas generating agent and a glass plate as well as a body in a plate form or in a thick film form, such as of acryl, olefin, polycarbonate, vinyl chloride, ABS, PET, nylon, urethane, polyimide, and the like, for example, can be cited.

In addition, the above-described adhesive (C) is not particularly limited and known thermosetting adhesives, and the like, for example, are appropriate.

The above-described commercially available dicing tape is not particularly limited and tapes such as the Adwill (registered trademark) D-series manufactured by Furukawa Electric Co., Ltd and the Elep Holder (registered trademark) UE series manufactured by Nitto Denko Corporation can be cited.

The above-described dicing tape used in the method for manufacturing an IC chip according to the first or third present invention is not particularly limited and known photo-curing adhesive tapes such as the above-described commercially available dicing tapes can be used.

Here, a polyimide film may be adhered in advance to a wafer as an insulator substrate before the above-described dicing tape is adhered. Heating is required at the time when the above-described polyimide film is adhered to the wafer. Accordingly, when the adhesive force of adhesive (A) is lowered by means of stimulation due to heat and the above-described adhesive (A) contains a gas generating agent for generating gas by means of stimulation due to heat, it is necessary to select the temperature wherein the adhesive force of adhesive (A) is lowered or wherein gas is generated become higher than the temperature where the above-described polyimide film is adhered to the wafer.

The method for manufacturing an IC chip according to the first, second or third present invention has, at least, the step of providing stimulation to the above-described adhesive (A) layer and the step of removing the above-described support tape from the above-described wafer.

Stimulation is provided to the above-described adhesive (A) layer while uniformly sucking under reduced pressure the entirety of the above-described wafer from the above-described dicing tape side during the above-described steps of the method for manufacturing an IC chip according to the first present invention in order to remove the above-described support tape from the above-described wafer.

Concretely, a fixed flat plate having gas permeability and an equipment having a pressure reduction device, such as a vacuum pump, for example, are used, a dicing tape to which a wafer is adhered is placed on the fixed flat plate having gas permeability and, stimulation is provided to the above-described adhesive (A) layer while sucking under reduced pressure from the opposite side of the fixed flat plate.

Stimulation is provided to the above-described adhesive (A) layer in the above-described manner and, thereby, gas is generated from the gas generating agent contained in the adhesive (A) layer so as to lower the adhesive force between the wafer and the adhesive (A) layer due to the pressure from the generated gas and the support tape can easily be removed. However, an extremely thin wafer having a thickness of approximately 50 µm, is weak in structural strength in comparison with a conventional wafer having a thickness of from approximately 100 to 600 µm and may become deformed and damaged when strong pressure is applied to a portion of the wafer due to locally generated gas from the gas generating agent. Therefore, suction by means of pressure reduction is uniformly applied to the entirety of the wafer from the dicing tape side so as to fix the entirety of the wafer and, thereby, the wafer and the fixed plate are integrated and the wafer is reinforced so that the wafer can be prevented from undergoing extreme deformation and can be prevented from undergoing damage due to locally generated gas that is nonuniformly.

Furthermore, suction under reduced pressure is uniformly applied to the entirety of the wafer from the dicing tape side so as to fix the entirety of the wafer and so as to reinforce the wafer at the time when the support tape is removed from the wafer and, therefore, the wafer can be prevented from undergoing deformation and from undergoing damage due to the force used to remove the support tape.

A plate comprising resin, or the like, wherein microscopic through holes are created and a plate comprising a porous material, such as a ceramic porous plate, for example, can be cited as the above-described fixed flat plate having gas permeability. It is preferable for the above-described fixed flat plate having gas permeability to be as flat as possible in order to secure the flatness of the wafer and to have a structural strength such that the wafer does not undergo deformation at the time of suction.

It is preferable for the above-described through holes to be uniformly created throughout the entire surface of the above-described fixed flat plate and it is necessary for the diameter of the holes to not be too large to a degree wherein the flatness of the wafer is reduced as a result of suction under reduced pressure and it is necessary for the diameter of the holes to be large enough to apply a sufficiently smooth suction under reduced pressure without lowering the productivity or the flatness of the wafer.

The adhesive force of adhesive (A) is lowered in the step of providing stimulation to the above-described adhesive (A) layer according to the method for manufacturing an IC chip according to the second present invention.

A gas is generated from the gas generating agent so that the generated gas removes at least a portion of the adhesive from the surface of the adhered body and, thereby, the adhesive force is lowered. At this time, the extremely thin wafer having a thickness of approximately 50 µm has a weak structural strength wherein warping easily occurs in comparison with a conventional wafer having a thickness of from approximatly 100 to 600 µm and, therefore, a strong pressure is applied to a portion of the wafer due to locally generated gas and, as a result, the wafer undergoes deformation or receives damage. A dicing tape that is not deformed by the pressure of the gas generated from the above-described gas generating agent is adhered in advance to the wafer according to the method for manufacturing an IC chip according to the second present invention and, thereby, such wafer deformation or damage do not occur. That is to say, the wafer is secured to, and integrated with, the dicing tape, which is not deformed by the pressure created by the gas generated from the gas generating agent, and, thereby, the wafer is reinforced and the wafer is not extremely deformed or damaged by locally and nonuniformly generated gas.

Furthermore, the dicing tape uniformly secures and reinforces the entirety of the wafer at the time when the support tape is removed from the wafer and, thereby, the wafer can be prevented from undergoing extreme deformation or damage even when the force for removing the support tape is applied to the wafer.

Stimulation is uniformly applied, together with the load, to the entirety of the wafer in the step of providing stimulation to the above-described adhesive (A) layer according to the method for manufacturing an IC chip according to the third present invention.

Stimulation is provided to the above-described adhesive (A) layer in the above-described manner and, thereby, gas is generated from the gas generating agent so that the generated gas removes at least a portion of the adhesive from the surface of the adhered body and, thereby, the adhesive force is lowered. At this time under conventional conditions the generated gas groups together creating a larger bubble and such a large bubble removes at least a portion of the adhesive from the surface of the adhered body. The generation of such large bubbles, however, is not uniform throughout the entirety of the wafer and dispersion of bubbles may occur depending on condition of adhesion and on the manner in which stimulation is provided. The extremely thin wafer having a thickness of approximately 50 µm has a weak structural strength wherein warping easily occurs in comparison with a conventional wafer having a thickness of from approximatly 100 to 600 µm and, therefore, the wafer undergoes deformation or receives damage due to unevenly applied pressure from large bubbles.

A load is uniformly applied to the entirety of the wafer at the time when the above-described stimulation is provided and, thereby, such nonuniformity of large bubbles can be prevented from occurring. That is to say, the creation of large bubbles becomes difficult due to the pressure caused by the uniformly applied load and, moreover, free movement of the generated gas on the surface of the adhesive becomes difficult and, therefore, gas cannot group together to create large bubbles. Accordingly, the generated gas creates microscopic bubbles uniformly located throughout the entirety of the surface of the adhesive, and, therefore, the pressure of the gas is uniformly applied to the entirety of the wafer, which prevents the wafer from undergoing deformation or damage.

Though the method for uniformly applying a load to the entirety of the above-described wafer is not particularly limited, a method of applying a load by utilizing an appropriate weight is suitable. Though the weight of the load at this time is not particularly limited, the weight should not be so large as to damage the IC chip.

In addition, though the material of which the above-described weight is made is not particularly limited, it is preferable for this material to be transparent in the case where the stimulation for generating the above-described gas is light. Concretely, a glass plate having a thickness of from approximately 1 to 2 cm is appropriate.

Next, the support tape is removed from the wafer. At this time the adhesive force of adhesive (A) is lowered by means of stimulation and, therefore, the support tape can easily be removed from the wafer.

Here, the adhesive force is lowered by generating gas from the gas generating agent in the adhesive (B) layer through provision of stimulation to the adhesive (B) layer and, then, the support tape is removed from the hard support plate prior to the removal of the support tape from the wafer in the case where adhesive containing a gas generating agent for generating gas by means of stimulation is used as the above-described adhesive (B) according to the method for manufacturing an IC chip of the first, second or third present invention and, thereby, the support tape having flexibility can be removed from the wafer by being peeled off so that the manner of removal of the support tape can be simplified and, therefore, wafer damage and deformation can be effectively prevented. Here, it is preferable to use the above-described method for manufacturing in the case where an IC chip is manufactured from a wafer wherein a fragile circuit is formed on the surface of the wafer because the number of steps increase.

The method for manufacturing an IC chip according to the first, second or third present invention has at least the step of dicing a wafer. A wafer wherein a circuit is formed on the surface is divided into chips by means of a diamond cutter in this step. The sizes thereof are usually square with sides of from several hundreds μm to several tens of mm.

BEST MODE FOR CARRYING OUT THE INVENTION

The present invention is more specifically described with reference to the examples below, but such examples are not intended to limit the scope of the present invention.

EXAMPLE 1

<Preparation of Adhesive>

The following compound is solved in ethyl acetate and polymerization is carried out by irradiation with ultraviolet rays in order to gain an acryl copolymer having a weight-average molecular weight of 700,000.

| | |
|---|---|
| butyl acrylate | 79 parts by weight |
| ethyl acrylate | 15 parts by weight |
| acrylic acid | 1 part by weight |
| 2-hydroxyethyl acrylate | 5 parts by weight |
| photopolymerization initiator (Irgacure 651, 50% ethyl acetate solution) | 0.2 parts by weight |
| lauryl mercaptan | 0.02 parts by weight |

3.5 parts by weight of methacrylic acid 2-isocyanate ethyl is added to 100 parts by weight of resin solid content of ethyl acetate solution containing the gained acrylic copolymer, and, furthermore, 20 parts by weight of pentaerythritol triacrylate, 0.5 parts by weight of photopolymerization initiator (Irgacure 651, 50% ethyl acetate solution) and 1.5 parts by weight of polyisocyanate are mixed with 100 parts by weight of resin solid content of ethyl acetate solution after reaction and, thereby, an ethyl acetate solution of adhesive (1) is prepared.

Furthermore, 100 parts by weight of 2,2'-azobis-(N-butyl-2-methylpropion amide) is mixed with 100 parts by weight of resin solid content of ethyl acetate solution of adhesive (1) so as to prepare adhesive (2), which contains a gas generating agent.

<Preparation of Support Tape>

An ethyl acetate solution of adhesive (1) is applied using a doctor knife to one side of a transparent polyethylene terephthalate (PET) film having a thickness of 100 μm wherein a corona treatment is carried out on both sides of the film so as to have a thickness of approximately 15 μm when the applied film has been dried and the applied solution is dried through the application of heat of 110° C. for 5 minutes. Next, a PET film on which a mold release treatment is carried out is adhered to the surface of the adhesive (1) layer.

The ethyl acetate solution of adhesive (1) is applied using a doctor knife to the PET film on which the mold release treatment has been carried out so as to have a thickness of approximately 15 μm when the applied film has been dried and the solvent is volatilized by heating at 110° C. for 5 minutes in order to dry the applied solution. After being dried the adhesive (1) layer exhibits adhesion in the dry condition.

Next, the surface which does not have the adhesive (1) layer of the PET film to which the adhesive (1) layer has been provided and on which a corona treatment has been carried out and the surface of the adhesive (1) layer of the PET film to which the adhesive (1) layer has been provided and on which a corona treatment has been carried out are adhered to each other. Thereby, support tape 1 which is set adhesive layers on both sides and of which the surface is protected by a PET film on which a mold release treatment is carried out.

On the other hand, an ethyl acetate solution of adhesive (2) is applied using a doctor knife to a PET film wherein a mold release treatment has been carried out on the surfaces of the PET film so as to have a thickness of approximately 10 μm when the applied film has been dried and the solvent is volatilized by heating at 110° C. for 5 minutes in order to dry the applied liquid. After being dried the adhesive (2) layer exhibits adhesion in the dry condition.

The PET film, on which a mold release treatment has been carried out, is removed from the surface of the adhesive (1) layer of one side of support tape 1 that is to be protected and the surface on which the adhesive (2) layer has been formed is adhered to the adhesive (2) layer of the PET film, on which a mold release treatment has been carried out. After that the product is left alone at 40° C. for 3 days.

Thereby, a support tape 2 is gained having the adhesive (1) layer on one side and a primer layer comprising adhesive (2) on the other side, which is the surface layer portion of the adhesive (1) layer, wherein the adhesive layer is protected by a PET film to the surface of which a mold release treatment has been carried out.

(Polishing Step)

The PET film that protects the adhesive (2) layer of support tape 2 is peeled off and the support tape is adhered to a silicon wafer having a diameter of 20.4 cm and a thickness of approximately 750 μm. Next, the PET film that protects the adhesive (1) layer is peeled off and the support tape is adhered to a glass plate having a diameter of 20.4 cm under reduced pressure environment. The glass plate that has been adhered to the silicon wafer via support tape 2 is attached to a polishing unit and polishing is carried out until the thickness of the silicon wafer becomes approximately 50 μm. The glass plate to which the silicon wafer has been adhered is removed from the polishing unit after the completion of polishing and a dicing tape is adhered to the surface of the silicon wafer.

(Removal Step of Wafer)

An ultraviolet ray irradiation unit provided with a fixture plate comprising a ceramic porous plate (average diameter of pores is 40 μm) and with a vacuum pump, so that the entirety of a wafer can be secured through suction by operating the vacuum pump, is used to remove support tape 2 from a silicon wafer by vertically lifting up the glass plate while sucking under reduced pressure after irradiating the dicing tape, to which the silicon wafer has been adhered placed on the ceramic porous plate, for 2 minutes with 365 nm ultraviolet rays having an illumination intensity that has been adjusted so as to be 40 mW/cm$^2$ on the surface of the glass plate using an ultra high pressure mercury lamp located on the glass plate side while sucking under reduced pressure.

(Dicing Step)

Subsequently the silicon wafer, which is reinforced by the dicing tape, is attached to a dicing unit and the silicon wafer is cut into IC chips using a cutter blade that cuts starting from the wafer side. Next, the dicing tape is peeled off and IC chips are gained.

The IC chip and the support plate can be adhered to each other with a high adhesive strength by using support tape 2 and the wafer can be polished so as to have a thickness of approximately 50 μm without damage to the wafer by polishing the wafer under the condition wherein the IC chips and support plate are adhered to each other. The wafer is irradiated with ultraviolet rays after polishing so that gas is generated from the gas generating agent and, thereby, the adhesive force of the support tape is significantly lowered and the wafer can easily be removed. In addition, suction under reduced pressure is uniformly carried out on the entirety of the wafer from the dicing tape side at this time and, thereby, the wafer is not damaged or deformed by the pressure of the generated gas.

EXAMPLE 2

(Polishing Step)

The PET film that protects the adhesive (2) layer of support tape 2, which has been prepared in Example 1, is peeled off and the support tape is adhered to a silicon wafer having a diameter of 20.4 cm and a thickness of approximately 750 μm. Next, the PET film that protects the adhesive (1) layer is peeled off and the silicon wafer is adhered to a glass plate having a diameter of 20.4 cm under reduced pressure environment. The glass plate that has been adhered to the silicon wafer via support tape 2 is attached to a polishing unit and polishing is carried out until the thickness of the silicon wafer becomes approximately 50 μm. The glass plate to which the silicon wafer has been adhered is removed from the polishing unit after the completion of polishing and a dicing tape comprising PET and having a thickness of 250 μm is adhered to the surface of the silicon wafer.

(Removal Step of Wafer)

The glass plate is vertically lifted up so that support tape 2 is peeled off from the silicon wafer after the silicon wafer has been irradiated with 365 nm ultraviolet rays for 2 minutes wherein the irradiation intensity has been adjusted so as to be 40 mW/cm$^2$ on the surface of the glass plate using an ultra high pressure mercury lamp located on the glass plate side.

(Dicing Step)

Subsequently the silicon wafer, which is reinforced by the dicing tape, is attached to a dicing unit and the silicon wafer is cut into IC chips using a cutter blade that cuts starting from the wafer side. Next, the dicing tape is peeled off and IC chips are gained.

The IC chip and the support plate can be adhered to each other with a high adhesive strength by using support tape 2 and the wafer can be polished so as to have a thickness of approximately 50 μm without damage to the wafer by polishing the wafer under the condition wherein the IC chips and support plate are adhered to each other. The wafer is irradiated with ultraviolet rays after polishing so that gas is generated from the gas generating agent and, thereby, the adhesive force of the support tape is significantly lowered and the wafer can easily be removed. In addition, the entirety of the wafer is uniformly secured by means of a dicing tape comprising PET and having a thickness of 250 μm at this time and, thereby, the wafer is not damaged or deformed by the pressure of the generated gas.

EXAMPLE 3

(Polishing Step)

The PET film that protects the adhesive (2) layer of support tape 2, which has been prepared in Example 1, is peeled off and the support tape is adhered to a silicon wafer having a diameter of 20.4 cm and a thickness of approximately 750 μm. Next, the PET film that protects the adhesive (1) layer is peeled off and the silicon wafer is adhered to a support plate that is a glass plate having a diameter of 20.4 cm under reduced pressure environment. The glass plate that has been adhered to the silicon wafer via support tape 2 is attached to a polishing unit and polishing is carried out until the thickness of the silicon wafer becomes approximately 50 μm. The support plate to which the silicon wafer has been adhered is removed from the polishing unit after the completion of polishing and a dicing tape is adhered to the surface of the silicon wafer.

(Removal Step of Wafer)

The silicon wafer to which the dicing tape has been adhered is placed with the dicing tape to the bottom and a glass plate having a diameter of 20 cm and a thickness of 1 cm is delicately placed on top of the support plate. Under this condition the wafer is irradiated for 2 minutes with 365 nm ultraviolet rays having an illumination intensity that has been adjusted so as to be 40 mW/cm$^2$ on the surface of the glass plate using an ultra high pressure mercury lamp located on the glass plate side. The support plate and support tape 2 are removed from the silicon wafer after the glass plate has been removed.

(Dicing Step)

Subsequently the silicon wafer, which is reinforced by the dicing tape, is attached to a dicing unit and the silicon wafer is cut into IC chips using a cutter blade that cuts starting from the wafer side. Next, the dicing tape is peeled off and IC chips are gained.

The IC chip and the support plate can be adhered to each other with a high adhesive strength by using support tape 2 and the wafer can be polished so as to have a thickness of approximately 50 μm without damage to the wafer by polishing the wafer under the condition wherein the IC chips and support plate are adhered to each other. The wafer is irradiated with ultraviolet rays after polishing so that gas is generated from the gas generating agent and, thereby, the adhesive force of the support tape is significantly lowered and the wafer can easily be removed. In addition, a load is uniformly applied to the entirety of the wafer at the time when gas is generated from the gas generating agent by placing a glass plate on the wafer and, thereby, the generated gas is prevented from grouping together to form large bubbles so that the wafer is not damaged or deformed by the pressure of the generated gas.

INDUSTRIAL APPLICABILITY

Because the present invention is constituted as described above, it is possible to provide a method for manufacturing an IC chip wherein a wafer is prevented from being damaged and the ease of handling thereof is improved so that the wafer can be appropriately processed into IC chips, even if a thickness of the wafer is extremely reduced to approximately 50 μm.

What is claimed is:

1. A method for manufacturing an IC chip comprising, at least:

the step of securing a wafer to a support plate via a support tape having a surface layer comprising an adhesive (A) containing a gas generating agent for generating a gas due to stimulation and a surface layer comprising an adhesive (B);

the step of polishing said wafer with securing said wafer to said support plate via said support tape;

the step of adhering a dicing tape to said polished wafer;

the step of providing said stimulation to said adhesive (A) layer;

the step of removing said support tape from said wafer; and the step of dicing said wafer, which comprises adhering said surface layer comprising adhesive (A) to said wafer and adhering said surface layer comprising adhesive (B) to said support plate in the step of securing said wafer to said support plate via said support tape, providing said stimulation while uniformly sucking under reduced pressure the entirety of said wafer from the dicing tape side thereof, and then removing said support tape from said wafer in the step of providing stimulation to said adhesive (A) layer and in the step of removing said support tape from said wafer.

2. A method for manufacturing an IC chip comprising, at least:

the step of securing a wafer to a support plate via a support tape having a surface layer comprising an adhesive (A) containing a gas generating agent for generating a gas due to stimulation and a surface layer comprising an adhesive (B);

the step of polishing said wafer with securing said wafer to said support plate via said support tape;

the step of adhering a dicing tape to said polished wafer;

the step of providing said stimulation to said adhesive (A) layer;

the step of removing said support tape from said wafer; and the step of dicing said wafer, which comprises adhering said surface layer comprising adhesive (A) to said wafer and adhering said surface layer comprising adhesive (B) to said support plate in the step of securing said wafer to said support plate via said support tape, and said dicing tape is not deformed by the pressure of a gas generated from said gas generating agent.

3. A method for manufacturing an IC chip having, at least:

the step of securing a wafer to a support plate via a support tape having a surface layer comprising an adhesive (A) containing a gas generating agent for generating a gas due to stimulation and a surface layer comprising an adhesive (B);

the step of polishing said wafer with securing said wafer to said support plate via said support tape;

the step of adhering a dicing tape to said polished wafer;

the step of providing said stimulation to said adhesive (A) layer;

the step of removing said support tape from said wafer; and the step of dicing said wafer, which comprises adhering said surface layer comprising adhesive (A) to said wafer and adhering said surface layer comprising adhesive (B) to said support plate in the step of securing said wafer to said support plate via said support tape, and said stimulation is provided while uniformly applying a load to the entirety of said wafer in the step of providing said stimulation to said adhesive (A) layer.

4. The method for manufacturing an IC chip according to claim 1, which comprises the step of removing the support plate from the support tape between the steps of adhering a dicing tape to the polished wafer and removing the support tape from the wafer.

5. The method for manufacturing an IC chip according to claim 2, which comprises the step of removing the support plate from the support tape between the steps of adhering a dicing tape to the polished wafer and removing the support tape from the wafer.

6. The method for manufacturing an IC chip according to claim 3, which comprises the step of removing the support plate from the support tape between the steps of adhering a dicing tape to the polished wafer and removing the support tape from the wafer.

* * * * *